(12) United States Patent
Matsumoto et al.

(10) Patent No.: US 8,034,213 B2
(45) Date of Patent: Oct. 11, 2011

(54) PLASMA PROCESSING APPARATUS AND PLASMA PROCESSING METHOD

(75) Inventors: Naoki Matsumoto, Amagasaki (JP);
Yoshinobu Hayakawa, Nirasaki (JP);
Hidetoshi Hanaoka, Nirasaki (JP);
Noriaki Kodama, Nirasaki (JP);
Chishio Koshimizu, Nirasaki (JP);
Manabu Iwata, Nirasaki (JP); Satoshi Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 480 days.

(21) Appl. No.: 11/694,083

(22) Filed: Mar. 30, 2007

(65) Prior Publication Data

US 2007/0227664 A1      Oct. 4, 2007

Related U.S. Application Data

(60) Provisional application No. 60/791,460, filed on Apr. 13, 2006.

(30) Foreign Application Priority Data

Mar. 30, 2006  (JP) .................................. 2006-092860

(51) Int. Cl.
*H01L 21/00* (2006.01)
*C23C 16/00* (2006.01)

(52) U.S. Cl. ............................... 156/345.47; 118/723 E

(58) Field of Classification Search ............... 118/723 E; 156/345.43, 345.44, 345.45, 345.46, 345.47
See application file for complete search history.

(56) References Cited

U.S. PATENT DOCUMENTS

| | | | |
|---|---|---|---|
| 5,494,522 A | | 2/1996 | Moriya et al. |
| 5,525,159 A | * | 6/1996 | Hama et al. ................. 118/723 I |
| 5,997,649 A | * | 12/1999 | Hillman ........................ 118/715 |
| 6,171,438 B1 | * | 1/2001 | Masuda et al. ........... 156/345.27 |
| 2002/0108933 A1 | * | 8/2002 | Hoffman et al. .......... 219/121.43 |
| 2003/0155078 A1 | * | 8/2003 | Ogasawara et al. ...... 156/345.47 |
| 2005/0061445 A1 | * | 3/2005 | Koshiishi et al. ......... 156/345.47 |
| 2005/0257743 A1 | | 11/2005 | Koshiishi et al. |
| 2006/0037703 A1 | * | 2/2006 | Koshiishi et al. ......... 156/345.47 |
| 2006/0037704 A1 | | 2/2006 | Iwata et al. |
| 2006/0066247 A1 | * | 3/2006 | Koshiishi et al. ......... 315/111.21 |
| 2007/0227665 A1 | * | 10/2007 | Matsumoto et al. ..... 156/345.47 |
| 2007/0227666 A1 | * | 10/2007 | Matsumoto et al. ..... 156/345.47 |

FOREIGN PATENT DOCUMENTS

| | | |
|---|---|---|
| CN | 1717788 A | 1/2006 |
| CN | 1734712 A | 2/2006 |
| JP | 6-283474 | 10/1994 |
| JP | 2004-305918 | 11/2004 |

* cited by examiner

*Primary Examiner* — Ram Kackar
*Assistant Examiner* — Anna Crowell
(74) *Attorney, Agent, or Firm* — Oblon, Spivak, McClelland, Maier & Neustadt, L.L.P.

(57) ABSTRACT

A plasma processing apparatus includes a processing vessel capable of being vacuum evacuated; a first electrode disposed in the processing vessel in a state electrically floating via an insulating member or a space; a second electrode, arranged in the processing vessel to face and be in parallel to the first electrode with a specific interval, supporting a substrate to be processed; a processing gas supply unit for supplying a desired processing gas into a processing space surrounded by the first electrode, the second electrode and a sidewall of the processing vessel; and a first radio frequency power supply unit for applying a first radio frequency power to the second electrode to generate a plasma of the processing gas in the processing space. An electrostatic capacitance between the first electrode and the processing vessel is set such that a desired plasma density distribution is obtained for the generated plasma.

16 Claims, 12 Drawing Sheets

PLASMA PROCESSING APPARATUS AND PLASMA PROCESSING METHOD

CROSS-REFERENCE TO RELATED APPLICATIONS

This document claims priority to Japanese Patent Application No. 2006-92860, filed on Mar. 30, 2006 and U.S. Provisional Application No. 60/791,460, filed on Apr. 13, 2006, the entire content of which are hereby incorporated by reference.

FIELD OF THE INVENTION

The present invention relates to a technique for performing a plasma processing on a substrate to be processed; and, more particularly, to a capacitively coupled plasma processing apparatus and a plasma processing method.

BACKGROUND OF THE INVENTION

In a manufacturing process of semiconductor devices or flat panel displays (FPDs), a plasma is used to perform a processing, such as etching, deposition, oxidation, sputtering or the like, so as to obtain a good reaction of a processing gas at a relatively low temperature. Conventionally, a capacitively coupled type plasma apparatus has been widely employed as a single-wafer plasma processing apparatus, especially, as a single-wafer plasma etching apparatus.

Generally, in the capacitively coupled plasma processing apparatus, an upper electrode and a lower electrode are disposed to face each other in parallel in a vacuum processing chamber, a substrate to be processed (a semiconductor wafer, a glass substrate or the like) is mounted on the upper electrode, and a radio frequency voltage is applied to either one of the upper and the lower electrode. Electrons are accelerated by an electric field formed by the radio frequency voltage to collide with a processing gas.

As a result of ionization by the collision between the electrons and the processing gas, a plasma is generated, and a desired microprocessing (for example, etching) is performed on the surface of the substrate by radicals or ions in the plasma. At this time, the electrode to which the radio frequency voltage is applied is connected with a radio frequency power supply via a blocking capacitor in a matching unit and thus serves as a cathode. A cathode coupling method in which the radio frequency voltage is applied to the lower electrode, serving as the cathode, for supporting the substrate enables an anisotropic etching by substantially vertically attracting ions in the plasma to the substrate with a self-bias voltage generated in the lower electrode (see, for example, Patent Document 1).

(Patent Document 1) Japanese Patent Laid-open Application No. H6-283474 & U.S. Pat. No. 5,494,522

In the conventional capacitively coupled plasma processing apparatus, an anode electrode to which no radio frequency power is applied is grounded. Typically, since the processing vessel is made of a metal such as aluminum or stainless steel and is frame-grounded, the anode electrode can be set to be at a ground potential via the processing vessel. For this reason, in case of a cathode coupling arrangement, the upper electrode serving as the anode electrode is built in the ceiling of the processing vessel to form a single body therewith, or the ceiling of the processing vessel itself is used as the upper electrode.

With a recent trend of miniaturization of design rules for the manufacturing process, a high-density plasma is required to be available at a low pressure for a plasma processing. In the capacitively coupled plasma processing apparatus as described above, the frequency of the radio frequency power tends to be gradually increased and a frequency of 40 MHz or greater is standardly used in recent years. However, if the frequency of the radio frequency power becomes high, a radio frequency current is made to be concentrated on a central portion of the electrode, so that a density of a plasma generated in a processing space between two electrodes becomes higher at the central portion of the electrode than that at the edge portion thereof. As a result, there occurs a problem that an in-surface uniformity of the process is considerably deteriorated.

SUMMARY OF THE INVENTION

It is, therefore, an object of the present invention to provide a plasma processing apparatus capable of improving an in-surface uniformity in a plasma process by uniformizing or controlling a spatial density distribution of plasma generated by applying radio frequency powers to two electrodes disposed to face each other in a capacitively coupled arrangement; and, also, to provide a plasma processing method employed therein.

In accordance with a first aspect of the present invention, there is provided a plasma processing apparatus including: a processing vessel capable of being vacuum evacuated; a first electrode disposed in the processing vessel to be in a state electrically floating via an insulating member or a space; a second electrode, arranged in the processing vessel to face and be in parallel to the first electrode with a specific interval, for supporting a substrate to be processed; a processing gas supply unit for supplying a desired processing gas into a processing space surrounded by the first electrode, the second electrode and a sidewall of the processing vessel; and a first radio frequency power supply unit for applying a first radio frequency power to the second electrode to generate a plasma of the processing gas in the processing space, wherein an electrostatic capacitance between the first electrode and the processing vessel is set such that a desired plasma density distribution is obtained for the plasma generated in the processing space.

In accordance with a second aspect of the present invention, there is provided a plasma processing method for performing a desired plasma processing on a substrate by using a plasma in a processing vessel capable of being vacuum evacuated, wherein a first and a second electrode are disposed in parallel to each other with a specific interval, the substrate is supported on the second electrode to face the first electrode, the processing vessel is vacuum evacuated to a specific pressure level, a desired processing gas is supplied into a processing space between the first electrode, the second electrode and the sidewall of the processing vessel, a first radio frequency power is supplied to the second electrode to thereby generate the plasma from the processing gas in the processing space, and wherein the first electrode is set to be in a state electrically floating from the processing vessel via an insulator or a space, and an electrostatic capacitance between the first electrode and the processing vessel is set such that a desired plasma density distribution is obtained for the plasma generated in the processing space.

In accordance with a capacitively coupled arrangement of the present invention, when the radio frequency power from the radio frequency power supply is applied to the second electrode, a plasma of the processing gas is generated in the processing space by a radio frequency discharge between the first and the second electrode and that between the second electrode and the sidewall of the chamber. The plasma thus generated is diffused in all directions, especially in upward and radially outward directions. Electron current in the plasma flows toward the ground via the first electrode, the sidewall of the chamber or the like.

Here, in accordance with the present invention, the first electrode is connected to the processing vessel in a state electrically floating via the insulator or the space. Therefore, when seen from the second electrode, there is further formed an impedance by the electrostatic capacitance between the first electrode and the ground potential. By setting the electrostatic capacitance around the first electrode to be an appropriate value, the spatial density distribution of the plasma generated in the processing space can be uniformized in a radial direction, or can be controlled as desired.

In the present invention, an electrostatic capacitance between the first electrode and the processing vessel is preferably equal to or smaller than 5000 pF; more preferably, equal to or smaller than 2000 pF; and still preferably, about 250 pF. In accordance with an embodiment of the present invention, a vacuum space separate from the processing space is formed between the processing vessel and a rear surface of the first electrode when viewed from the second electrode. This vacuum space serves to thermally insulate the first electrode, prevent an electrical discharge from the first electrode, and set the dielectric constant of the electrostatic capacitance to be the lowest. It is also possible that a first insulator covers an entire or partial region of an inner wall of the vacuum space.

In order to lower the electrostatic capacitance around the first electrode, it is preferable that an entire or partial area of the processing vessel is made up of a second insulator, wherein the area faces the rear surface of the first electrode when viewed from the second electrode.

In accordance with another embodiment of the present invention, a gas chamber, to which a processing gas is to be introduced, is provided to an upper portion of or above the first electrode, and a plurality of gas injection openings for injecting the processing gas from the gas chamber into the processing space are formed in the first electrode. In this manner, the first electrode can function as a shower head as well without affecting the electrically floating state thereof.

Further, in accordance with another embodiment of the present invention, a ring-shaped insulator is provided to fill a gap between the outer peripheral surface of the first electrode and the sidewall of the processing vessel. The ring-shaped insulator serves to physically sustain the first electrode, and is one of elements that constitute the electrostatic capacitance between the first electrode and the processing vessel.

In accordance with another embodiment of the present invention, a space is formed between an outer peripheral surface of the first electrode and the sidewall of the processing vessel. Further, the first electrode is partitioned into a disk-shaped inner electrode and a ring-shaped outer electrode in a radial direction. Further, a fourth insulator of a ring shape is inserted, or a space is formed, between the inner electrode and the outer electrode. Alternatively, a fifth insulator of a ring shape is inserted, or a space is formed, between the outer electrode and the sidewall of the processing vessel. It is preferable that an electrostatic capacitance between the outer electrode and the processing vessel is greater than that between the inner electrode and the processing vessel.

Further, in accordance with another embodiment of the present invention, the first electrode is partitioned into a disk-shaped inner electrode and a ring-shaped outer electrode in a radial direction, a fourth insulator of a ring shape is inserted between the inner electrode and the outer electrode, and a fifth insulator of a ring shape is inserted between the outer electrode and the sidewall of the processing vessel. With this configuration, the ground capacitance of the inner electrode can be reduced remarkably, and the effect of relatively decreasing the plasma density at the electrode central portion to thereby relatively increase the plasma density of the electrode edge portion can be magnified.

In accordance with the plasma processing apparatus or the plasma processing method, it is possible to, by means of the above-described configurations and functions, uniformize or control a spatial density distribution of plasma generated by a capacitively coupled radio frequency discharge. Thus, the in-surface uniformity in the plasma process can be improved.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, embodiments of the present invention will be described with reference to the accompanying drawings.

Figure 1:
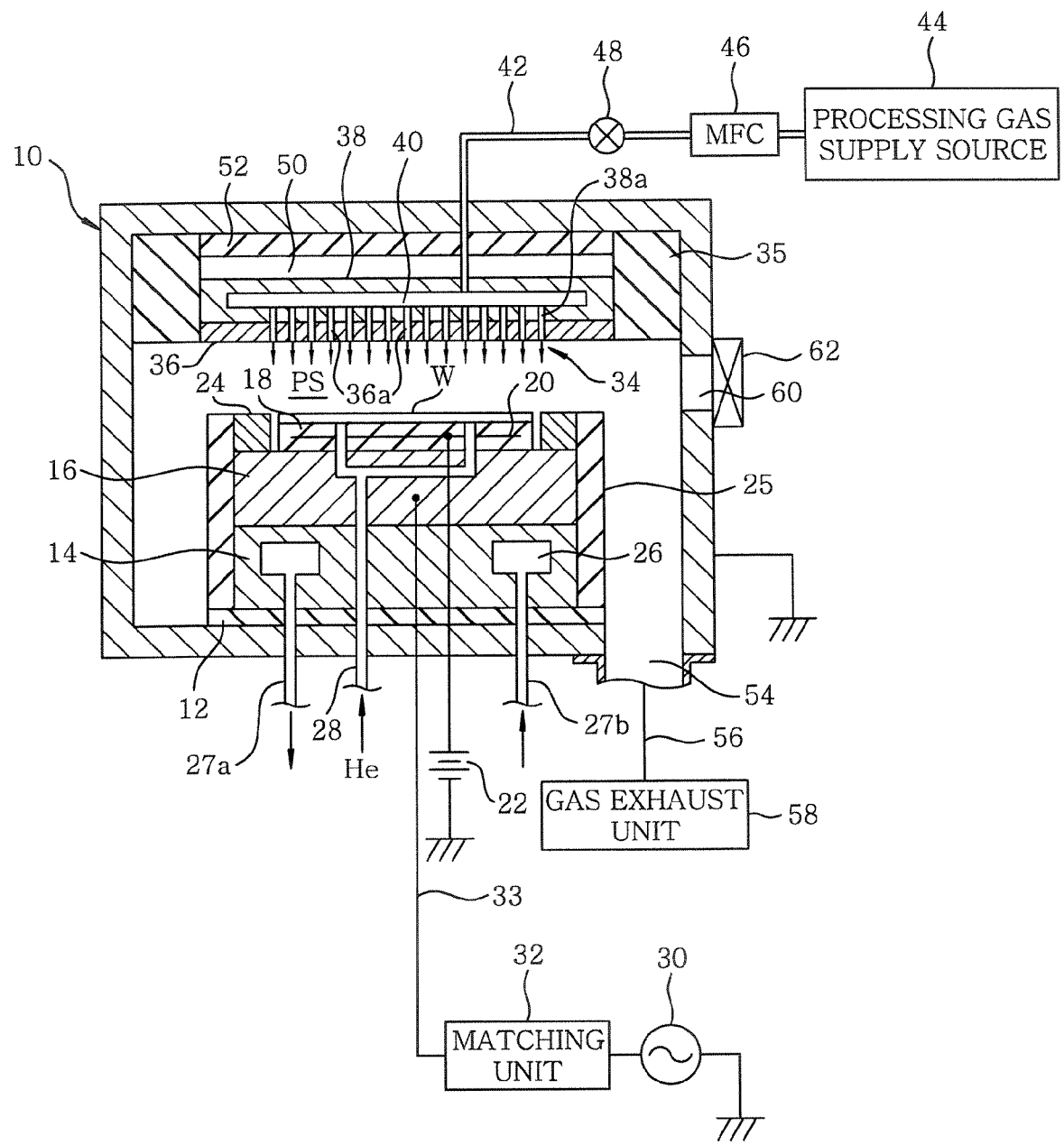
FIG. 1 is a longitudinal cross sectional configuration view of a plasma etching apparatus in accordance with an embodiment of the present invention.

FIG. 1 illustrates a configuration of a plasma processing apparatus in accordance with an embodiment of the present invention. The plasma processing apparatus is configured as a capacitively coupled (parallel plate type) plasma processing apparatus of a cathode coupling type. The plasma processing apparatus has a cylindrical vacuum chamber (processing chamber) 10 made of, e.g., an aluminum whose surface is alumite-treated (anodically oxidized), and the chamber 10 is frame grounded.

A cylindrical susceptor support 14 is provided at a bottom portion in the chamber 10 via an insulation plate 12 made of ceramic or the like. Further, a susceptor 16 made of, e.g., aluminum, is disposed above the susceptor support 14. The susceptor 16 serves as a lower electrode and a target substrate, e.g., a semiconductor wafer W, is mounted thereon.

On the top surface of the susceptor 16, there is disposed an electrostatic chuck 18 for attracting and holding the semiconductor wafer with an electrostatic adsorptive force. The electrostatic chuck 18 includes an electrode 20 formed of a conductive film which is inserted between a pair of insulating layers or sheets. A DC power supply 22 is connected to the electrode 20. The electrostatic chuck 18 is allowed to attract and hold the semiconductor wafer W thereon with a Coulomb force generated by a DC voltage applied from the DC power supply 22 thereto. A focus ring 24 made of, e.g., silicon is disposed to surround the electrostatic chuck 18 to improve an etching uniformity. Further, an inner wall member 25 made of, e.g., quartz is attached to the side surfaces of the susceptor 16 and the susceptor support 14.

A coolant path 26 is circumferentially provided inside the susceptor support 14. A coolant, e.g., cooling water, of a specific temperature is supplied into and circulated along the coolant path 26 from an external chiller unit (not shown) via coolant lines 27a, 27b. Accordingly, the processing temperature of the semiconductor wafer W on the susceptor 16 can be controlled by the temperature of the coolant. Further, a thermally conductive gas, e.g., He gas, is supplied into a gap between the top surface of the electrostatic chuck and the backside of the semiconductor wafer W from a thermally conductive gas supply unit (not shown) via a gas supply line 28.

A radio frequency power supply 30 for plasma generation is electrically connected to the susceptor 16 via a matching unit 32 and a power supply rod 33. The radio frequency power supply 30 applies a radio frequency power of a specific frequency, e.g., about 40 MHz, to the susceptor 16 when a plasma processing is performed in the chamber 10.

The upper electrode 34 is provided above the susceptor 16 to face the susceptor 16 in parallel. Further, the upper electrode 34 has an electrode plate 36 having a plurality of gas injection openings 36a and an electrode support 38 for detachably holding the electrode plate 36, the electrode plate 36 being made of a semiconductor material, e.g., Si, SiC or the like, the electrode support 38 being made of a conductive material, e.g., aluminum whose surface is alumite-treated. The upper electrode 34 is attached in a state electrically floating with respect to the chamber 10 via a ring-shaped insulator 35. A plasma generation space or a processing space PS is defined by the upper electrode 34, the susceptor 16 and the sidewall of the chamber 10. The ring-shaped insulator 35, which is made of, e.g., alumina ($Al_2O_3$), is attached so that a gap between an outer peripheral surface of the upper electrode 34 and the sidewall of the chamber 10 can be airtightly sealed. The ring-shaped insulator 35 physically holds the upper electrode 34 and electrically forms a part of capacitance between the upper electrode 34 and the chamber 10.

The electrode support 38 has therein a gas buffer space 40 and also has on its bottom surface a plurality of gas ventholes 38a extending from the gas buffer space 40 to communicate with the gas injection openings 36a of the electrode plate 36. The gas buffer space 40 is connected with a processing gas supply source 44 via a gas supply line 42, and a mass flow controller MFC 46 and an opening/closing valve 48 are provided in the gas supply line 42. When a specific processing gas is introduced from the processing gas supply source 44 into the gas buffer space 40, the processing gas is injected into the processing space PS toward the semiconductor wafer W on the susceptor 16 in a shower shape from the gas injection openings 36a of the electrode plate 36. So, the upper electrode 34 also serves as a shower head for supplying a processing gas into the processing space PS.

Further, the electrode support 38 has therein a passageway (not shown) through which a coolant, e.g., cooling water, flows, so that a temperature of the entire upper electrode 34, particularly the electrode plate 36, can be controlled to a specific level with the coolant supplied from an external chiller unit. In order to further stabilize the temperature control of the upper electrode 34, a heater (not shown) including, e.g., a resistance heating element may be attached to an inside or a top surface of the electrode support 39.

An interval of a specific size is formed between the top surface of the upper electrode 34 and the ceiling of the chamber 10, and a vacuum space 50 is formed in an entire or partial portion of the interval. The vacuum space 50 serves to thermally insulate the upper electrode 34 from the chamber 10 or its vicinities, and to prevent an electrical discharge between the upper electrode 34 and the chamber 10 by excluding gases therefrom. Further, since the dielectric constant of the vacuum is 1, the vacuum space 50 also functions to minimize the capacitance between the upper electrode 34 and the chamber 10. The vacuum space 50 is vacuum evacuated independently of the processing space PS, and maintains the vacuum state by means of an airtight structure thereof.

In this embodiment of the present invention, in order to enhance the effect of preventing the electrical discharge, an entire or partial region of the inner wall of the vacuum space 50 (only the top surface in case of the illustrated example) is covered with a sheet type insulator 52. While a polyimide resin having a high heat resistance can be appropriately employed as the insulator 52, Teflon (registered trademark) or quartz can also be employed as the insulator 52.

An annular space defined by the susceptor 16, the susceptor support 14 and the sidewall of the chamber 10 serves as a gas exhaust space. A gas exhaust port 54 of the chamber 10 is provided at a bottom of the gas exhaust space. A gas exhaust unit 58 is connected with the gas exhaust port 58 via a gas exhaust line 56. The gas exhaust unit 58 has a vacuum pump such as a turbo molecular pump or the like, so that the inside of the chamber 10, especially the processing space PS, can be depressurized to a required vacuum level. Moreover, attached to the sidewall of the chamber 10 is a gate valve 62 for opening and closing a loading/unloading port 60 for the semiconductor wafer W.

In the plasma etching apparatus, in order to perform an etching process, the gate valve 62 is opened and a semiconductor wafer W to be processed is loaded into the chamber 10 to be mounted on the electrostatic chuck 18. Then, a specific processing gas, i.e., an etching gas (generally, a gaseous mixture) is supplied into the chamber 10 from the processing gas supply source 44 at a specified flow rate and flow rate ratio, while the chamber 10 is evacuated by the gas exhaust unit 58 such that the internal pressure of the chamber 10 is maintained at a specific vacuum level.

Further, a radio frequency power (40 MHz) of a specific power level is applied to the susceptor 16 from the radio frequency power supply 30. Further, a DC voltage is applied to the electrode 20 of the electrostatic chuck 18 from the DC power supply 46, whereby the semiconductor wafer W is firmly fixed on the electrostatic chuck 18. The etching gas injected from the upper electrode 34 as the shower head is converted into a plasma by a radio frequency discharge in the plasma space PS, and films formed on the main surface of the semiconductor wafer W are etched by radicals or ions present in the plasma.

By applying a radio frequency power of at least about 40 MHz to the susceptor (lower electrode) 16, this capacitively coupled plasma etching apparatus can increase the density of the plasma in an appropriately dissociated state. Thus, a high-density plasma under a low pressure can be generated. Further, since the plasma etching apparatus is of a cathode coupling type, an anisotropic etching can be performed by attracting ions in the plasma onto the wafer W substantially vertically by using a self-bias voltage generated in the susceptor 16.

Figure 2:
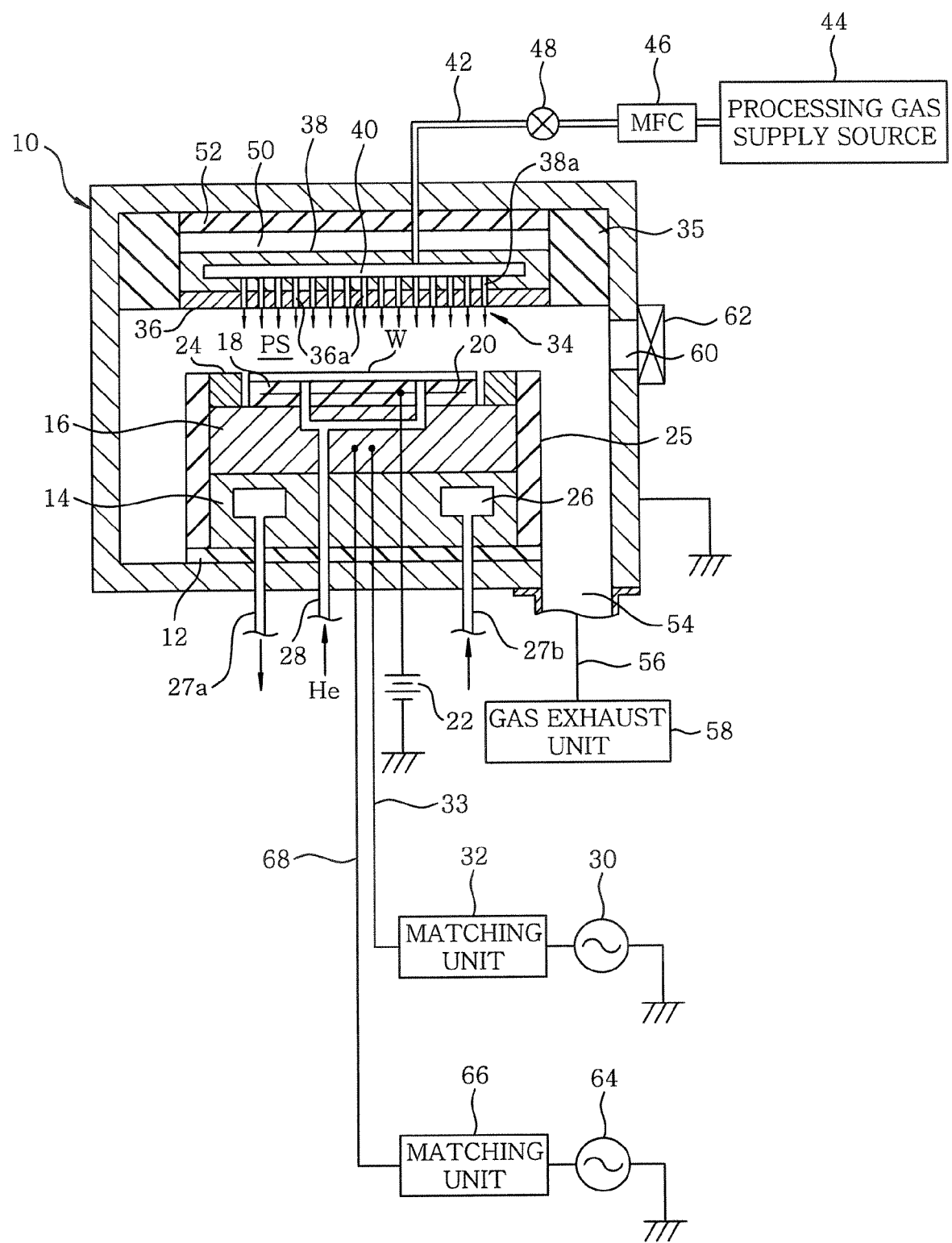
FIG. 2 sets forth a longitudinal cross sectional configuration view of a first modification example of the plasma etching apparatus in accordance with the embodiment of the present invention.

Further, the apparatus can be configured as a lower electrode dual frequency type, in which a lower electrode is supplied with a first radio frequency power of a relatively radio frequency (e.g., about 40 MHz) suitable for plasma generation and, at the same time, a second radio frequency power of a relatively low frequency (e.g., about 2 MHz) suitable for ion attraction. In this configuration, it is preferable that, as shown in FIG. 2, the apparatus further includes a radio frequency power supply 64 for supplying the second radio frequency power, a matching unit 66 and a power supply rod 68. In this lower electrode dual frequency type, the density of the plasma generated in the processing space PS is optimized by the first radio frequency power (of about 40 MHz), and the self-bias voltage and ion sheath occurred at the susceptor 16 can be appropriately controlled by the second radio frequency power (of about 2 MHz). Thus, an anisotropic etching with a higher selectivity becomes possible.

Hereinafter, features of the plasma etching apparatus in accordance with the present invention will be explained. As mentioned above, the plasma etching apparatus is of a cathode coupling type, and the upper electrode 34 is connected to the chamber 10 in a state electrically floating via the ring-shaped insulator 35, the upper vacuum space 50 and the like.

Figure 3:
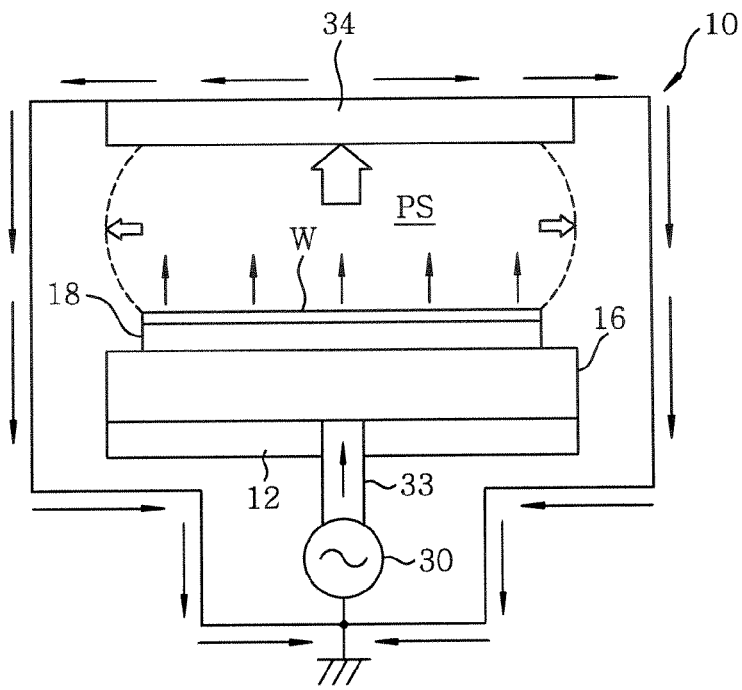
FIG. 3 provides a schematic view describing a capacitively coupled radio frequency discharge mechanism of a plasma etching apparatus in accordance with a comparative example.

First of all, as for a comparative example, there will be described a case where the upper electrode 34 is directly attached to the chamber 10 to be DC-connected with the ground potential, for example. In this case, as shown in FIG. 3, when the radio frequency power from the radio frequency power supply 30 is applied to the susceptor 16, a plasma of the processing gas is generated in the processing space PS by a radio frequency discharge between the susceptor 16 and the upper electrode 34 and that between the susceptor 16 and the sidewall of the chamber 10. The plasma thus generated is diffused in all directions, especially in upward and radially outward directions. Electron current in the plasma flows toward the ground via the upper electrode 34, the sidewall of the chamber 10 or the like.

In the susceptor 16, as the frequency of the radio frequency power increases, a radio frequency current is likely to be gathered at the central portion of the susceptor due to skin effect and the susceptor 16 is closer to the upper electrode 34 than the sidewall of the chamber 10, the upper electrode 34 and the sidewall of the chamber 10 having a same potential (ground potential). Accordingly, a larger amount of radio frequency power is discharged from the central portion of the electrode toward the processing space PS. Thus, most of the plasma electron current flows in the upper electrode 34, especially in the central portion thereof, while a considerably small part of the plasma electron current flows in the sidewall of the chamber 10. As a result, the plasma density spatial distribution in the central portion of the electrode is highest and significantly different from that in the edge portion of the electrode.

Figure 4:
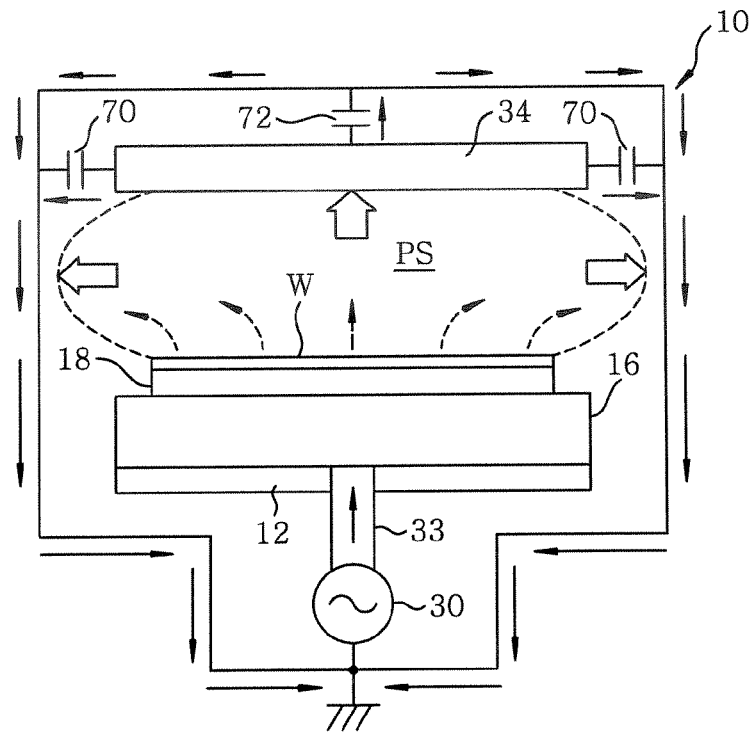
FIG. 4 depicts a schematic view describing a capacitively coupled radio frequency discharge mechanism of the plasma processing apparatus in accordance with the embodiment of the present invention.

However, since the upper electrode 34 is connected to the chamber 10 in a floating state in the present embodiment, the plasma distribution in the processing space PS is oriented outward in a radial direction as shown in FIG. 4. In FIG. 4, the upper electrode 34 is electrically connected to the chamber 10 via capacitive elements 70 and 72. Here, the capacitive element 70 is equivalent to an electrostatic capacitance between the upper electrode 34 and the sidewall of the chamber 10, which is formed mainly via the ring-shaped insulator 35. Meanwhile, the capacitive element 72 is equivalent to an electrostatic capacitance between the upper electrode 34 and the ceiling of the chamber 10, which is formed mainly via the vacuum space 50 and the insulator 52.

In this case as well, when the radio frequency power from the radio frequency power supply 30 is applied to the susceptor 16, the plasma of the processing gas is generated in the processing space PS by a radio frequency discharge between the susceptor 16 and the upper electrode 34 and that between the susceptor 16 and the sidewall of the chamber 10. The plasma thus generated is diffused in upward and radially outward directions, and an electron current in the plasma flows toward the ground via the upper electrode 34, the sidewall of the chamber 10 or the like. In the susceptor 16, a radio frequency current is likely to be gathered at the central portion of the susceptor. Also, as the case shown in FIG. 3, the susceptor 16 is located closer to the upper electrode 34 than the sidewall of the chamber 10.

However, since impedances of capacitive elements 70 and 72 are applied between the upper electrode 34 and the ground potential, the radio frequency current does not flow easily to the upper electrode 34 disposed directly above the susceptor 16 even though it is gathered at the central portion of the susceptor 16. For this reason, a proportion of electron current that flows to the sidewall of the chamber 10 cannot be considered to be low in the plasma. Theoretically, by adjusting the capacitances of the capacitive elements 70 and 72, it is possible to control a proportion of the electron current flowing between the susceptor 16 and the upper electrode 34 and that flowing between the susceptor 16 and the sidewall of the chamber 10. Therefore, it is also possible to control the spatial distribution of plasma density to be uniform in a radial direction.

Figure 5:
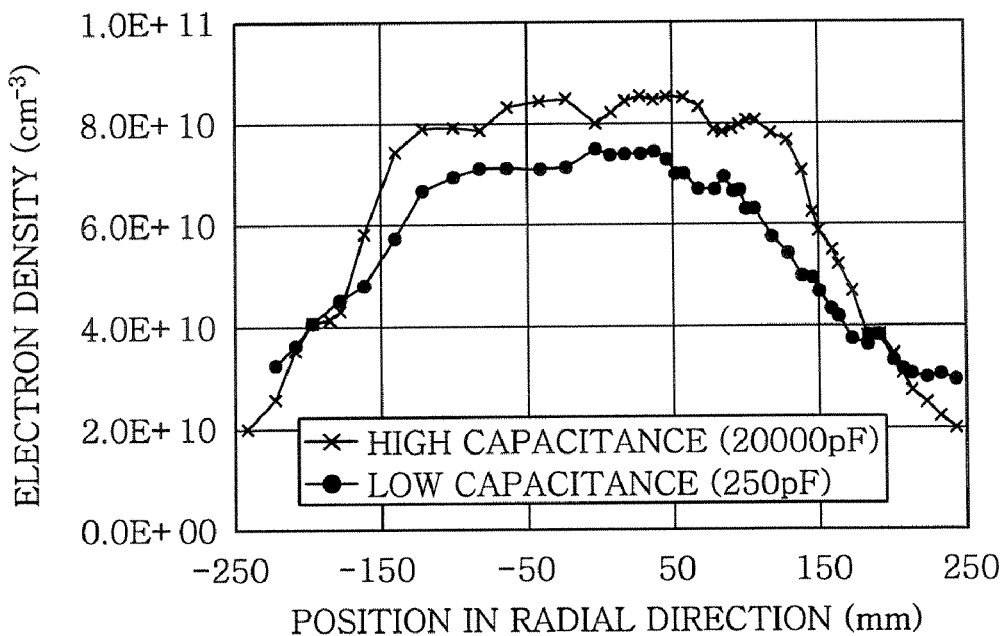
FIG. 5 presents graphs comparatively showing spatial distributions of electron density when a ground capacitance of an upper electrode is set to be of a high level and a low level, respectively, in the plasma etching apparatus in accordance with the embodiment of the present invention.
Figure 6:
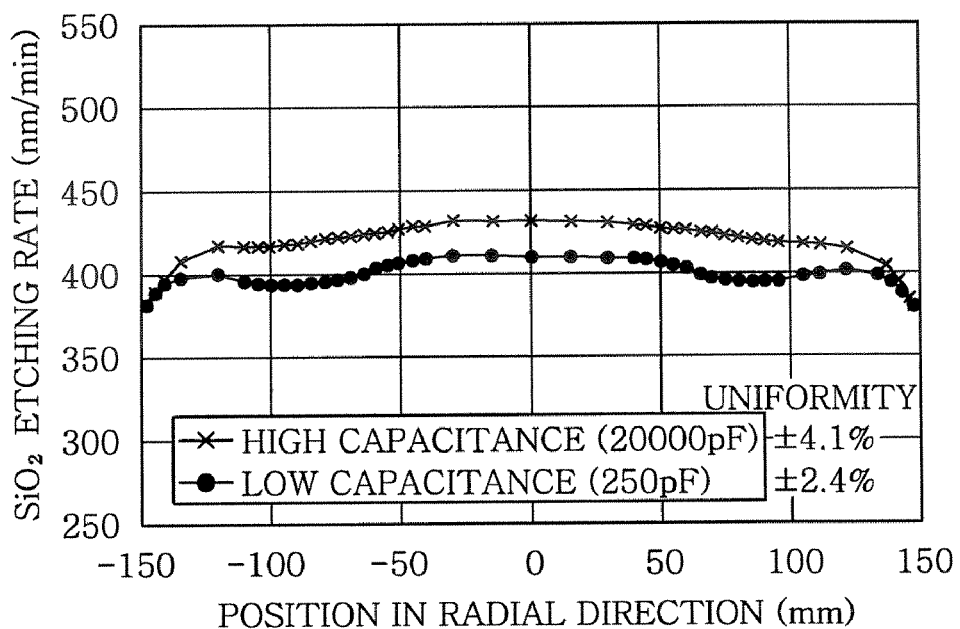
FIG. 6 offers graphs comparatively showing in-surface distributions of etching rate of an oxide film when the ground capacitance of the upper electrode is set to be of the high level and the low level, respectively, in the plasma etching apparatus in accordance with the embodiment of the present invention.
Figure 7:
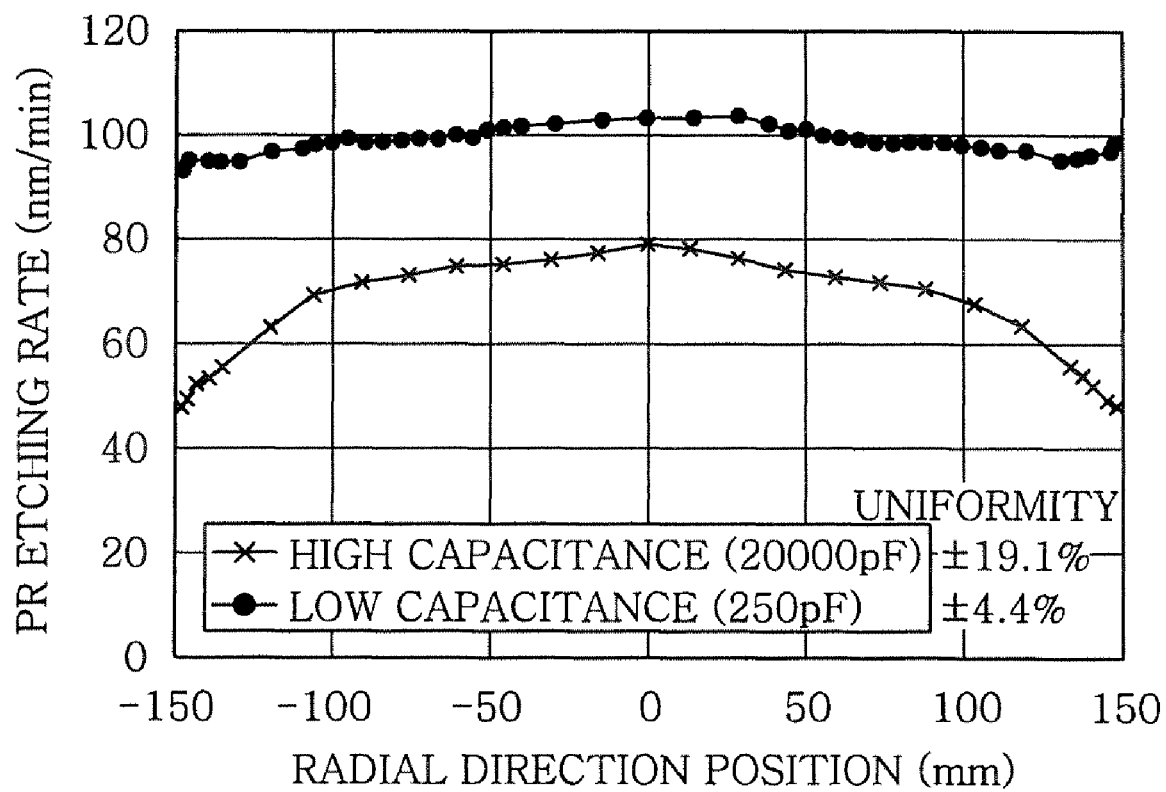
FIG. 7 provides graphs comparatively showing in-surface uniformities of etching rate of a photoresist when the ground capacitance of the upper electrode is set to be of the high level and the low level, respectively, in the plasma etching apparatus in accordance with the embodiment of the present invention.

FIGS. 5 to 7 show spatial distributions of electron density Ne, and in-surface variations of etching rates of an oxide film ($SiO_2$) and a photoresist (PR). Described therein are results of experiments in which, while performing an etching of $SiO_2$ via holes by using the plasma etching apparatus (shown in FIG. 2) in accordance with the present embodiment, a ground capacitance of the upper electrode 34, i.e., a total capacitance of the capacitive elements 70 and 72 adjacent to the upper electrode 34, was set to be either 20000 pF (high capacitance) or 250 pF (low capacitance). Main etching conditions therefor were as follows:

wafer diameter: 300 mm;
processing gases and flow rates thereof:
$C_4F_6/C_4F_8/Ar/O_2$=40/20/500/60 sccm;
pressure in the chamber: 30 mTorr;
radio frequency powers: 40 MHz/2 MHz=2500 W/3200 W.

As clear from FIGS. 5 to 7, when the ground capacitance of the upper electrode 32 was high (20000 pF), the electron density Ne decreased rapidly near a wafer edge portion (near R=±120 mm), whereas it was uniformly high at a wafer central portion. Since the etching rates of the oxide film and the photoresist both depend on the electron density distribution, in-surface uniformities thereof were not good, just ±4.1% and ±19.1%, respectively.

In contrast, when the ground capacitance of the upper electrode 34 was low (250 pF), the electron density Ne decreased at the wafer central portion, whereas it increased outside the wafer region (−150 mm to 150 mm), i.e., at a gas exhaust region. Thus, the difference between the plasma densities of the wafer central portion and the wafer edge portion was reduced. Accordingly, the difference of the etching rate of the oxide film, and that of the photoresist as well, between the wafer central portion and the wafer edge portion were also reduced. In particular, the etching rate of the oxide film decreased only at the wafer central portion, whereas it hardly decreased at the wafer edge portion. Thus, the in-surface uniformity of the etching rate of the oxide film was improved to be ±2.4%. Further, the etching rate of the photoresist increased in an overall aspect, and its in-surface uniformity was greatly improved to be ±4.4%.

As such, by changing the electrostatic capacitance (i.e., the ground capacitance) adjacent to the upper electrode 34 from the high level (20000 pF) to the low level (250 pF), the amount of electron current flowing between the susceptor 12 and the upper electrode 34 was able to be relatively reduced. Since the amount of electron current flowing between the susceptor 12 and the sidewall of the chamber 10 relatively increased, the plasma density at an electrode central portion was also relatively reduced, whereby the plasma density at an electrode edge portion was relatively increased. As a result, the in-surface uniformities of the oxide film and the photoresist were improved as well. Particularly, the dramatic improvement of the in-surface uniformity of the etching rate of the photoresist (from 19.1% to 4.4%) is a level that has not been achieved in the prior art.

The inventors followed up such experiments as above, and found out that the above-described in-surface uniformity of etching rate can be achieved by setting the ground capacitance of the upper electrode 34 to be no greater than about 5000 pF. Moreover, it was confirmed that the in-surface uniformity of etching rate can be made to reach a significant degree that is practically meaningful by setting the ground capacitance of the upper electrode 34 to be low, no greater than about 2000 pF.

Figure 8:
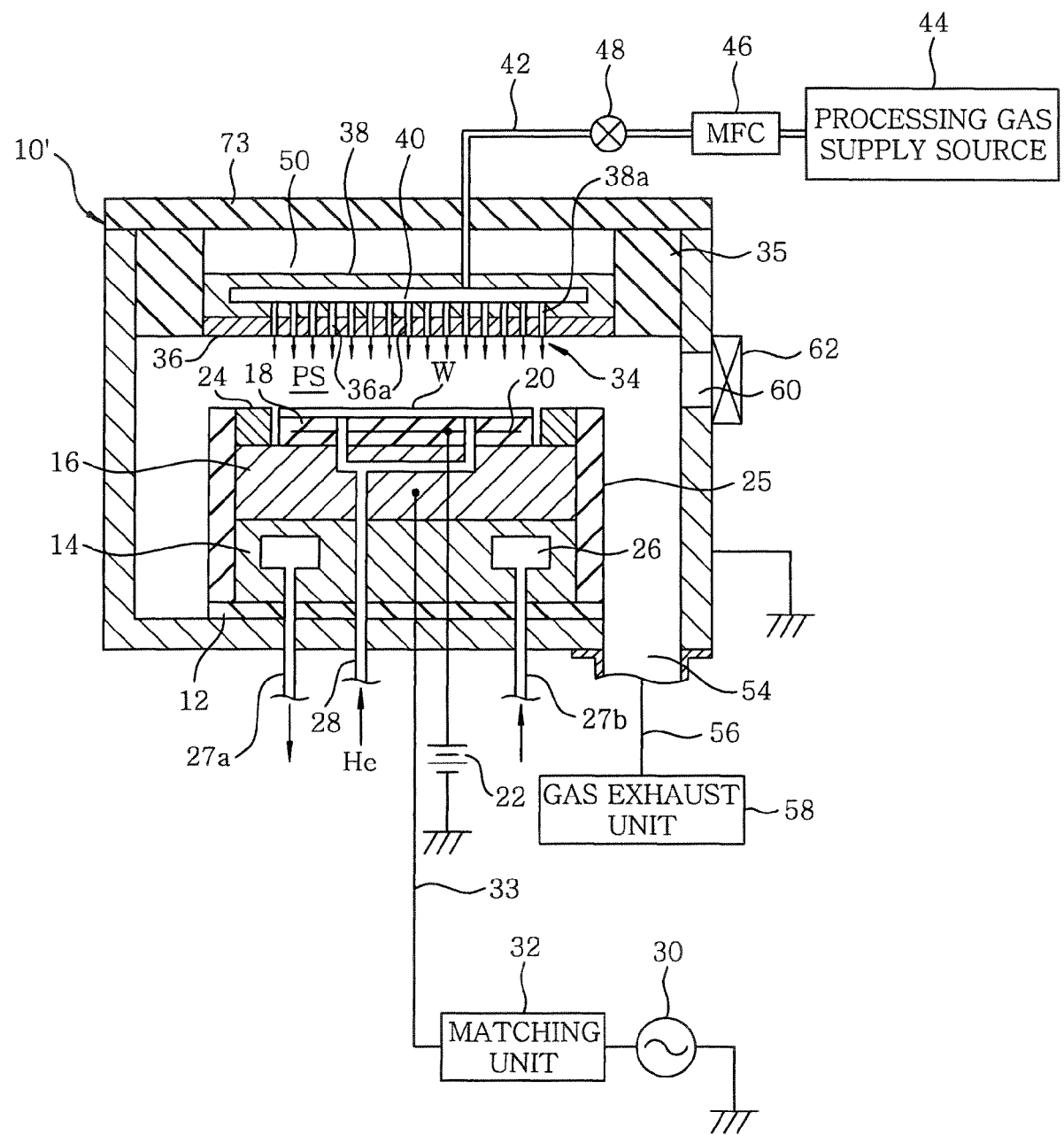
FIG. 8 is a longitudinal cross sectional configuration view of a second modification example of the plasma etching apparatus in accordance with the embodiment of the present invention.
Figure 9:
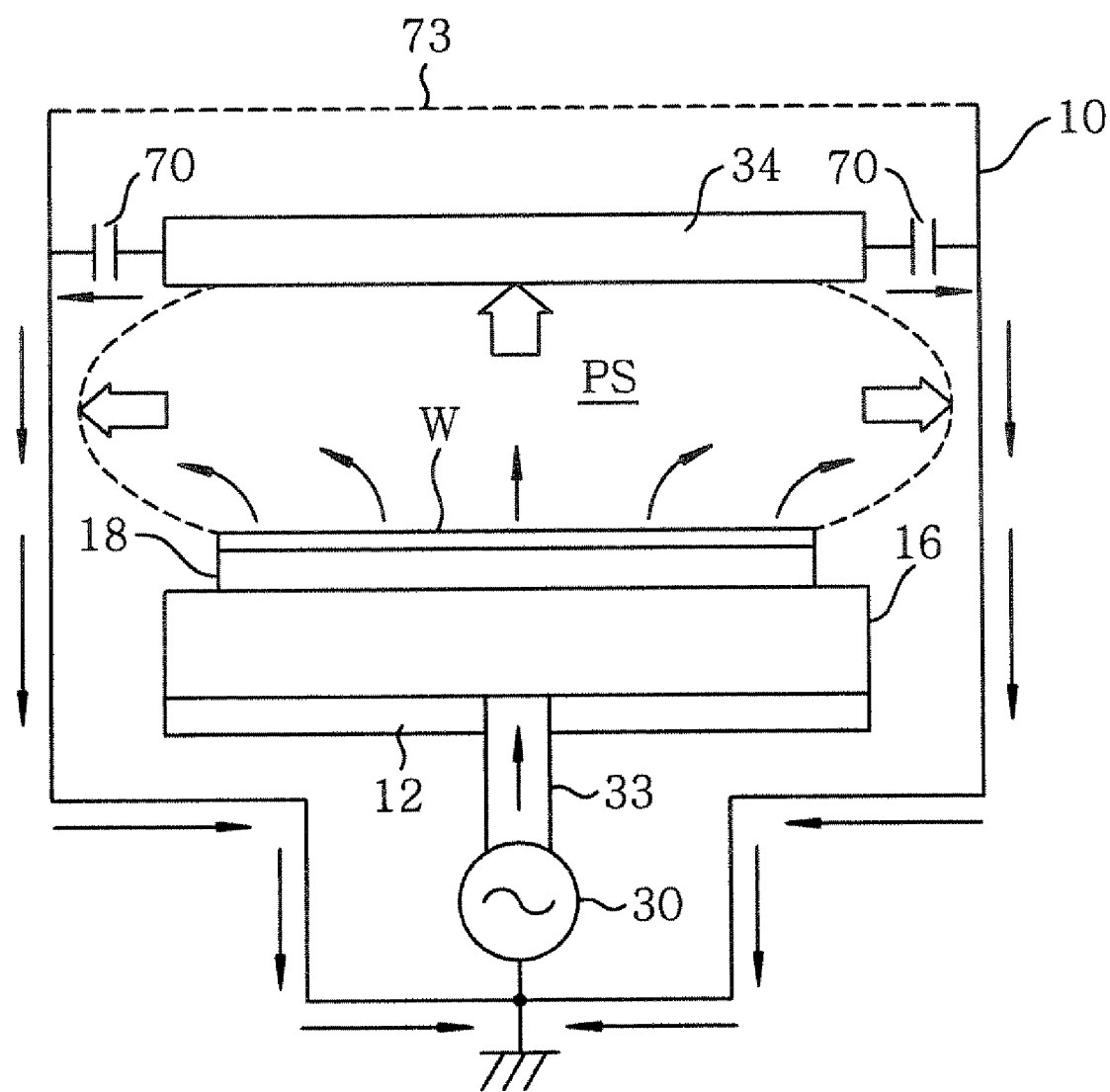
FIG. 9 sets forth a schematic view describing a capacitively coupled radio frequency discharge mechanism of the plasma etching apparatus of FIG. 8.
Figure 10:
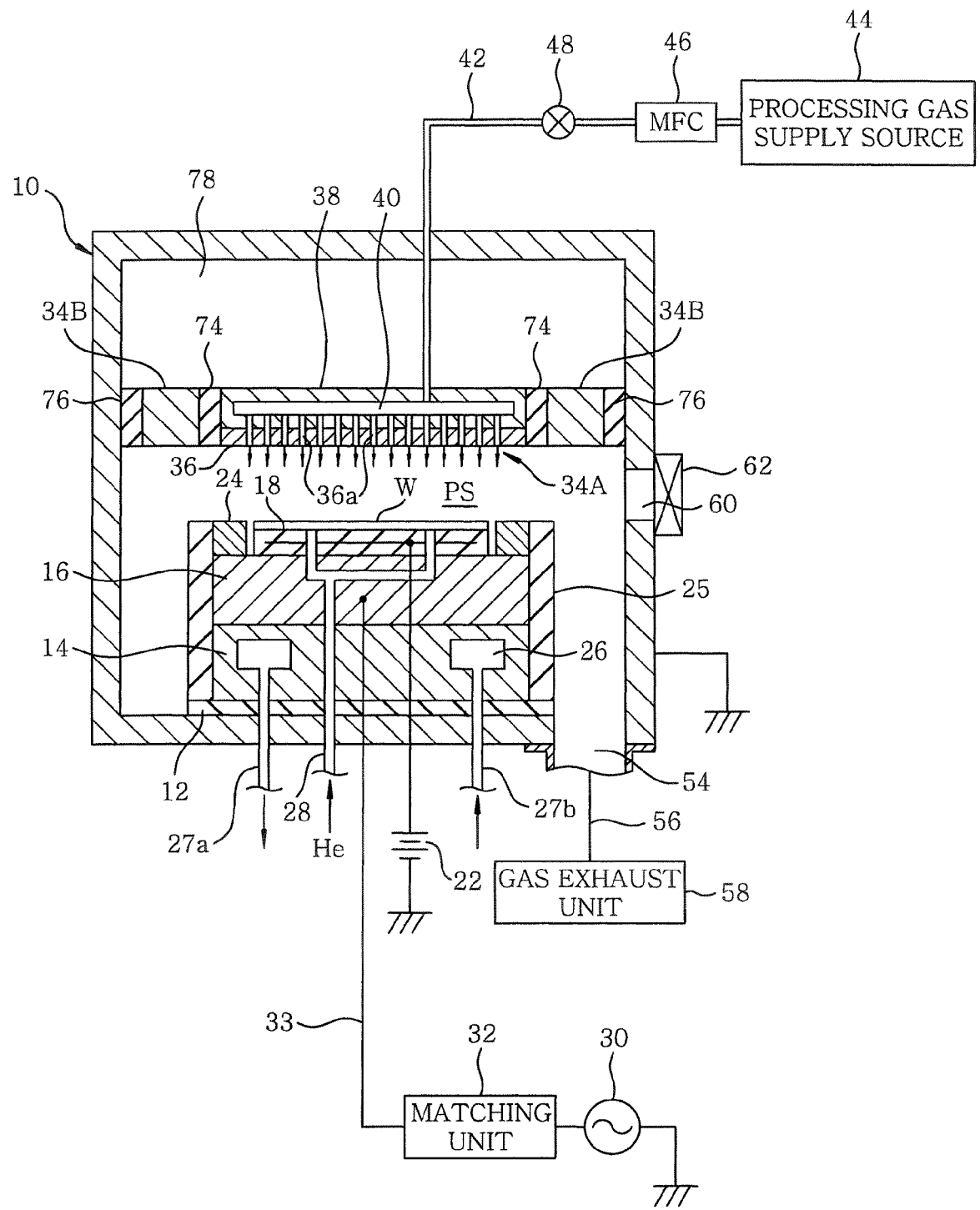
FIG. 10 shows a longitudinal cross sectional configuration view of a third modification example of the plasma etching apparatus in accordance with the embodiment of the present invention.

FIGS. 8 to 10 illustrate modification examples of the embodiment of the plasma etching apparatus, capable of lowering the ground capacitance of the upper electrode. In a modification example shown in FIG. 8, a portion of a chamber 10' that faces the rear surface (i.e., upper surface) of the upper electrode 34, which is the ceiling portion of the chamber 10', is made of an insulator 73. In this configuration, a capacitive coupling between the rear surface of the upper electrode 34 and the ceiling portion of the chamber 10' can be minimized or completely removed; and, as shown in FIG. 9, a ground capacitance of the upper electrode 34 can be made electrically equivalent to that with no capacitive element 72 (shown in FIG. 4) on the rear side of the upper electrode 34.

As a result, the effect of relatively reducing the plasma density at the electrode central portion to thereby relatively increase the plasma density at the electrode edge portion can be further enhanced. The capacitance of the rear or top capacitive element 72 is minimized by forming the entire ceiling portion of the chamber 10' with the insulator 73 in the example of FIG. 8. However, it is also possible to form a periphery portion of the ceiling portion with a conductor. In such a case, by varying the area ratio between the conductor and the insulator 73 appropriately, the capacitance of the rear or top capacitive element 72 can be controlled to be a desired level.

In a modification example shown in FIG. 10, the upper electrode is partitioned into two parts in a radial direction: a disk-shaped inner upper electrode 34A and a ring-shaped outer upper electrode 34B. A ring-shaped inner insulator 74 is airtightly inserted between the two upper electrodes 34A and 34B, and a ring-shaped outer insulator 76 is airtightly inserted between the outer upper electrode 34B and the sidewall of the chamber 10. Though it is preferred that the two ring-shaped insulators 74 and 76 are made of quartz having a small dielectric constant, ceramic or alumina ($Al_2O_3$) can be used instead. Further, it is also possible to provide spaces in place of the two ring-shaped insulators 74 and 76. Additionally provided between the two upper electrodes 34A and 34B and the ceiling of the chamber 10 is a space 78 communicating with the atmosphere.

Figure 11:
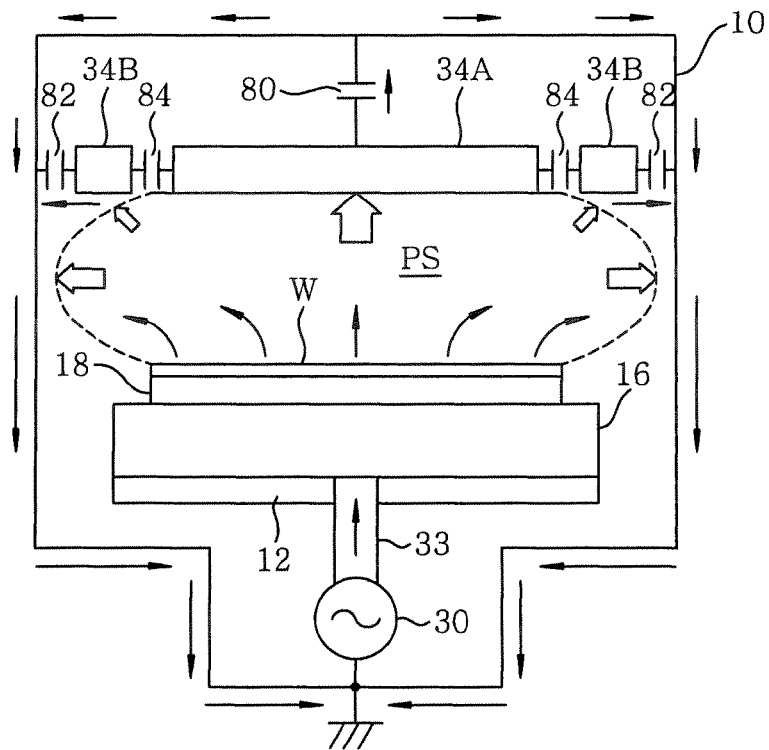
FIG. 11 presents a schematic view describing a capacitively coupled radio frequency discharge mechanism of the plasma etching apparatus of FIG. 10.

In this configuration, the two upper electrodes 34A and 34B are both in an electrically floating state. As illustrated in FIG. 11, a capacitive element 80 is effectively present between the inner upper electrode 34A and the chamber 10; a capacitive element 82 is effectively present between the outer upper electrode 34B and the chamber 10; and a capacitive element 84 is present between the inner upper electrode 34A and the outer upper electrode 34B. Here, the capacitive element 80 is formed mainly via the space 78; the capacitive element 82 is formed mainly via the outer ring-shaped insulator 78; and the capacitive element 84 is formed mainly via the inner ring-shaped insulator 74.

If a radio frequency power is applied to the susceptor 16 from the radio frequency power supply 30, a plasma of an etching gas is generated in the processing space PS due to a radio frequency discharge between the susceptor 16 and the inner upper electrode 34A, that between the susceptor 16 and the outer upper electrode 34B, and that between the susceptor 16 and the sidewall of the chamber 10. A part of the electron current in the plasma flows to the ground through a first path (the inner upper electrode 34A→the capacitor 80→the chamber 10), and another part of the electron current flows to the ground through a second path (the outer upper electrode 34B→the capacitor 82→the chamber 10). Still another part of the electron current in the plasma flows to the ground through a third path (the inner upper electrode 34A→the capacitor 84→the outer upper electrode 34B→the capacitor 82→the chamber 10). The remaining part of the electron current directly reaches the sidewall of the chamber 10 and flows to the ground.

Since the impedance of the third path is the highest among these four paths, the amount of current flowing therethrough is small, and the total amount of current flowing to the ground from the inner upper electrode 34A decreases. As much as the decrement, the proportion of current flowing to the second path or to the sidewall of the chamber 10 increases. As a result, a plasma density at an electrode central portion is relatively reduced, whereby the effect of relatively increasing the plasma density at an electrode edge portion can be further magnified. Further, the outer upper electrode 34B can be configured to function as a shower head as well by providing a gas chamber and gas injection openings in the upper electrode 34B.

Moreover, the electrostatic capacitance between the outer upper electrode 34B and the chamber 10 can be set to be higher than the electrostatic capacitance between the inner upper electrode 34A and the chamber 10. In this manner, it is guaranteed that the proportion of current flowing to the second path or to the chamber 10 can be increased in comparison with that flowing to the first or the third path.

Figure 12:
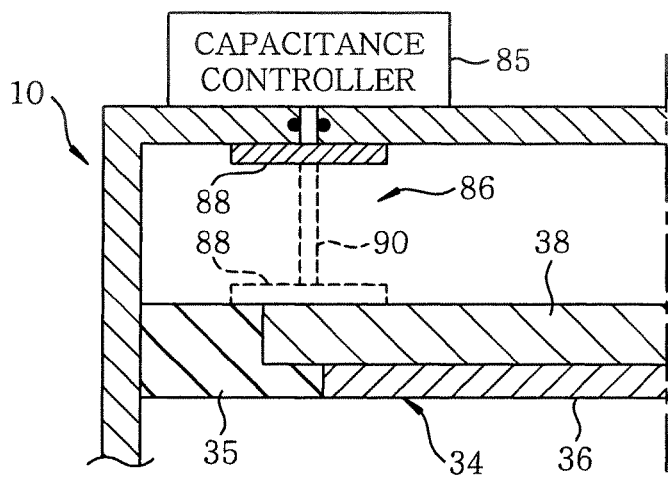
FIG. 12 is a partial cross sectional view showing a first exemplary configuration of a capacitance varying unit of the plasma etching apparatus in accordance with the embodiment of the present invention.
Figure 13:
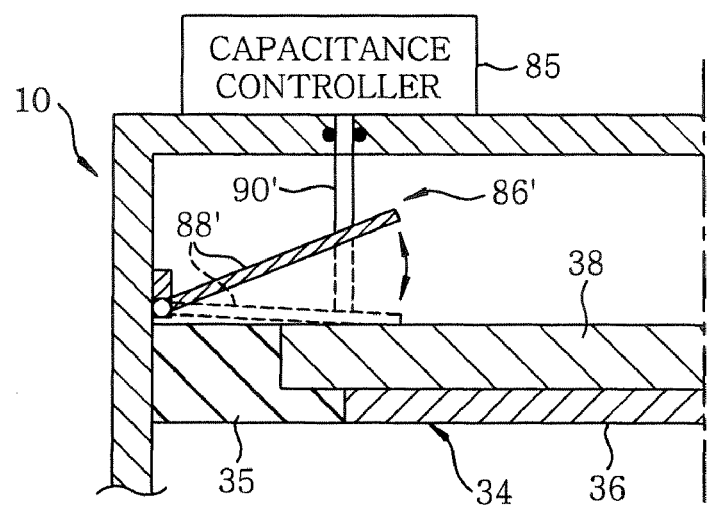
FIG. 13 is a partial cross sectional view showing a second exemplary configuration of the capacitance varying unit of the plasma etching apparatus in accordance with the embodiment of the present invention.
Figure 14:
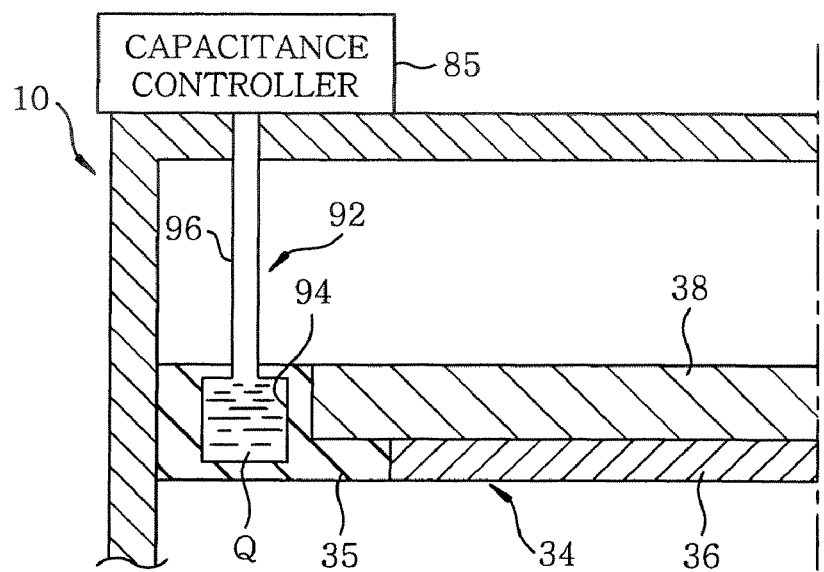
FIG. 14 is a partial cross sectional view showing a third exemplary configuration of the capacitance varying unit of the plasma etching apparatus in accordance with the embodiment of the present invention.

The plasma etching apparatus in accordance with the present embodiment may be configured such that the electrostatic capacitance or the ground capacitance adjacent to the upper electrode 34 is variable. FIGS. 12 to 14 illustrate configuration examples of a capacitance varying unit.

A capacitance varying unit 86 shown in FIG. 12 includes a conductive plate 88, a manipulation mechanism 90 and a capacitance controller 85; and a capacitance varying unit 86' shown in FIG. 13 includes a conductive plate 88', a manipulation mechanism 90' and a capacitance controller 85. Each of the conductive plates 88 and 88' is movable between a first position near or in contact with the top surface of the upper electrode 34 and a second position upwardly apart from the upper electrode 34. Further, each of the manipulation mechanisms 90 and 90' moves the conductive plate 88 or 88' up and down. Further, the capacitance controller 85 controls the electrostatic capacitance of the upper electrode 34 to be a desired level.

The manipulation mechanism 90 of FIG. 12 is made of a conductive material or a material that has a high conductivity at a radio frequency (or a material that has a low impedance at a radio frequency), and it is grounded directly or via the chamber 10. However, the manipulation mechanism 90' of FIG. 13 may be formed of an insulator.

In accordance with this configuration, the ground capacitance of the upper electrode 34 can be varied by adjusting a height or position of the conductive plate 88 or 88'. As the conductive plate 88 or 88' gets closer to the ceiling surface of the chamber 10, the ground capacitance of the upper electrode 34 can be made smaller. However, the ground capacitance of the upper electrode 34 increases as the conductive plate 88 or 88' comes closer to the top surface of the upper electrode 34. In an extreme case, the ground capacitance of the upper electrode 34 can be made infinite by making the conductive plate 88 or 88' contact the upper electrode 34 to ground the upper electrode 34.

A capacitance varying unit 92 shown in FIG. 14 has a configuration in which a ring-shaped liquid accommodation chamber 94 is formed in a ring-shaped insulator 35 provided between the upper electrode 34 and the sidewall of the chamber 10. A certain amount of liquid Q having an appropriate dielectric constant (e.g., an organic solvent such as galden) is capable of being put into or drawn out of the chamber 10 via a liquid line 96. By changing the substance (which determines the dielectric constant) or the amount of the liquid Q, the electrostatic capacitance of the entire ring-shaped insulator 35 and, further, the ground capacitance of the upper electrode 34 can be varied.

Further, as another configuration example, a variable capacitor (not shown) may be connected between the upper electrode 34 and the chamber 10.

Figure 15:
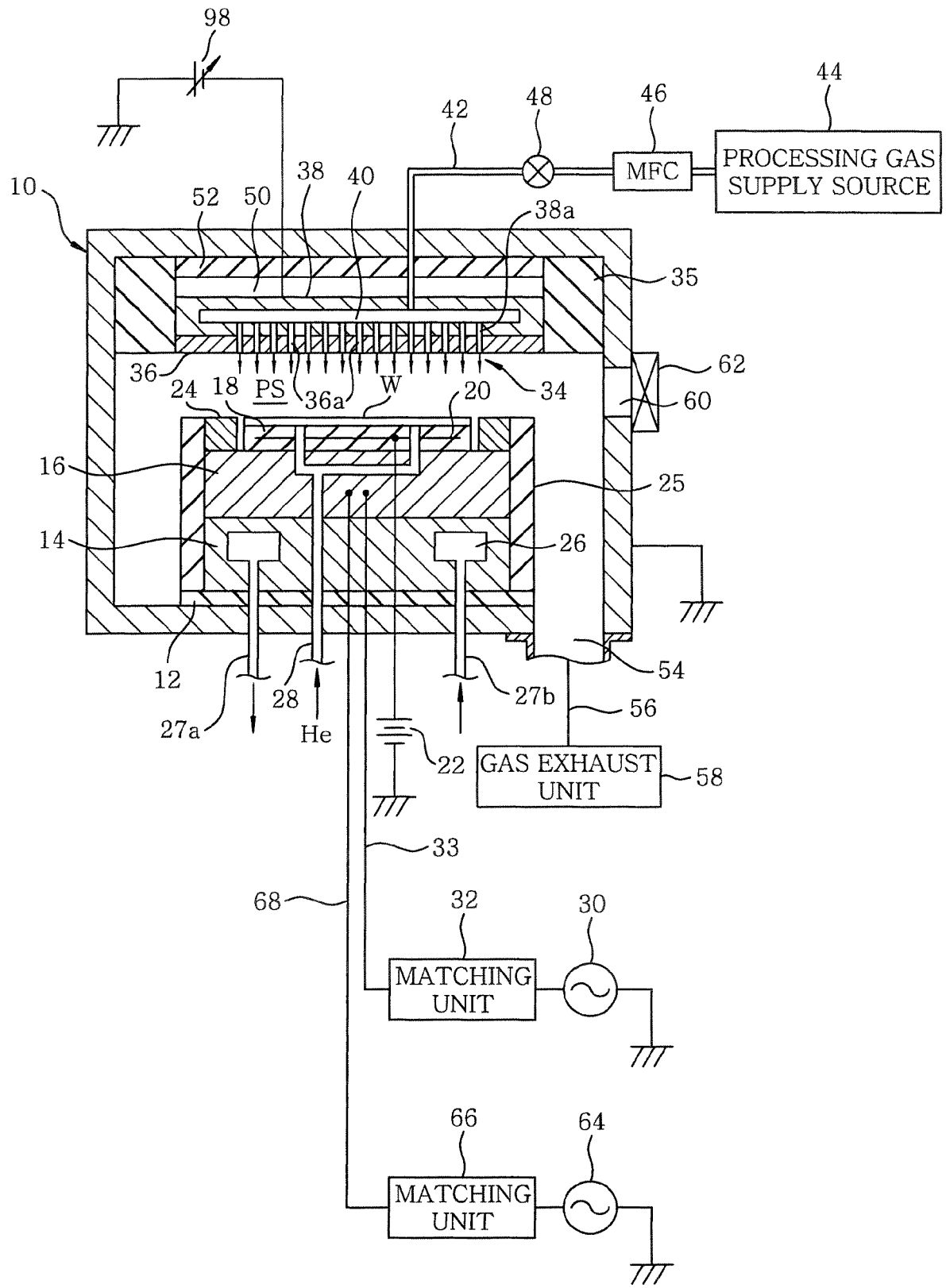
FIG. 15 offers a longitudinal cross sectional configuration view of a fourth modification example of the plasma etching apparatus in accordance with the embodiment of the present invention.

Further, as shown in FIG. 15, it is also possible to set up a configuration in which a DC power supply 98 is electrically connected to the upper electrode 34 to thereby apply a DC voltage to the upper electrode 34. In this case, the upper electrode 34 can be operated at a DC voltage in an electrically floating state with respect to the potential of the chamber 10, i.e., the ground potential.

By applying an appropriate DC voltage to the upper electrode 34, at least one of the following effects (1) to (4) can be obtained: (1) a sputtering (removal of deposits) for the upper electrode 34 can be performed better because of an increase in an absolute value of self-bias voltage at the upper electrode 34; (2) a plasma region that is being formed becomes smaller due to an expansion of a plasma sheath at the upper electrode 34; (3) electrons collected around the upper electrode 34 can be emitted onto a target object (semiconductor wafer W); (4) a plasma potential can be controlled; (5) an electron density (plasma density) can be increased; and (6) a plasma density at an electrode central portion can be increased.

Figure 16:
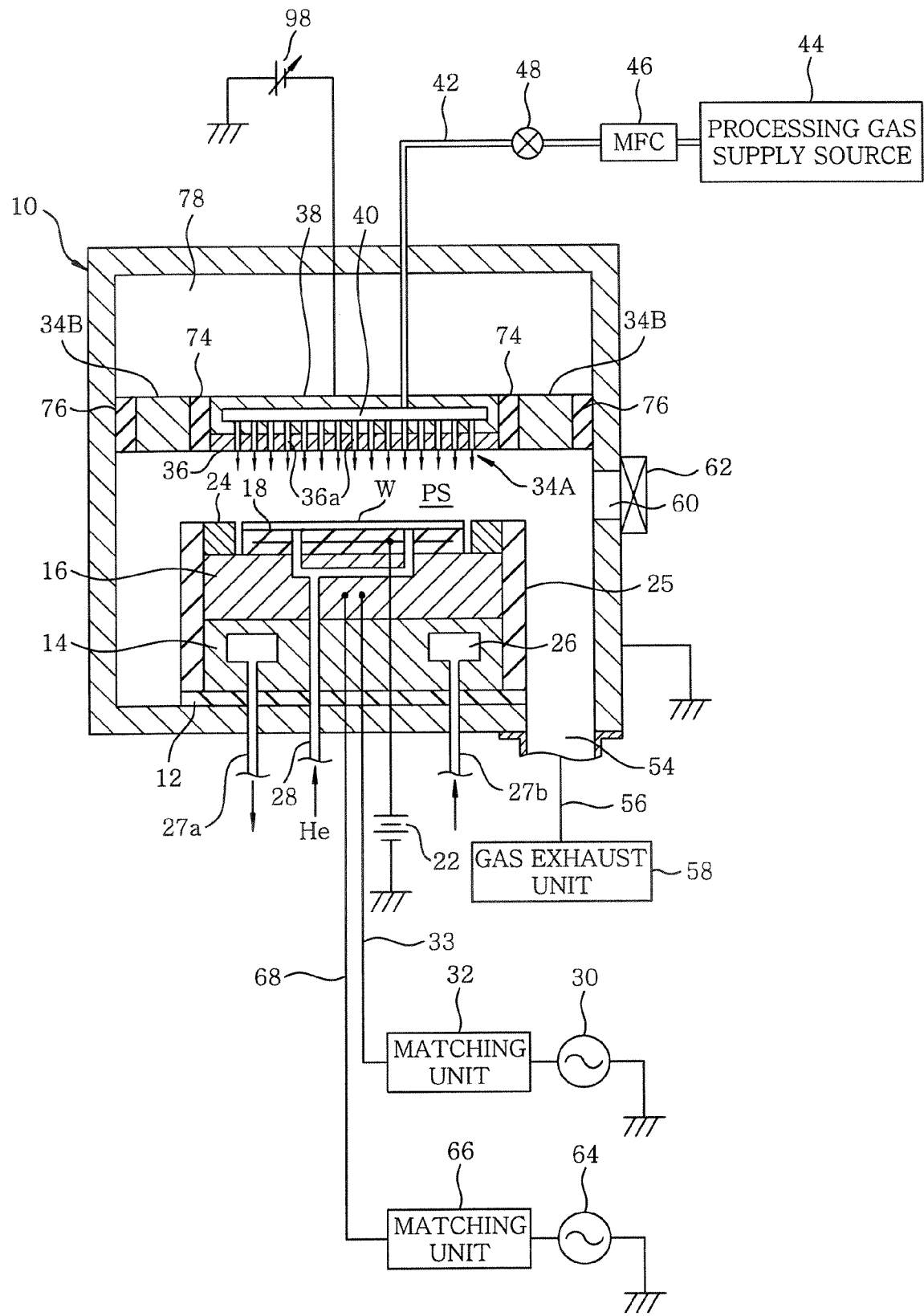
FIG. 16 depicts a longitudinal cross sectional configuration view of a fifth modification example of the plasma etching apparatus in accordance with the embodiment of the present invention.

Further, it is also possible to set up a configuration as shown in FIG. 16. Specifically, this configuration employs a mechanism of supplying a first radio frequency power to the susceptor 16 from the radio frequency power supply 30 via the matching unit 32 and the power supply rod 33, while concurrently supplying a second radio frequency power to the susceptor 16 from the radio frequency power supply 64 via the matching unit 66 and the power supply rod 68 (the lower electrode dual frequency type), as in the case shown in FIG. 2. In addition, it further employs a configuration as shown in FIG. 10, in which the upper electrode 34 is partitioned into two parts: a disk-shaped inner upper electrode 34A and a ring-shaped outer upper electrode 34B.

While the floating state of the upper electrode 34 with respect to the ground potential of the upper electrode 34 has been described in the aspect of the electrostatic capacitance, it can also be described in the aspect of impedance instead.

In the aforementioned description with reference to FIGS. 5 to 7, it has been disclosed that, the in-surface uniformity of etching rate can be enhanced if the ground capacitance of the upper electrode 34 is equal to or smaller than about 5000 pF, and that this effect can be secured if the ground capacitance of the upper electrode 34 is equal to or smaller than about 2000 pF. Explaining this in the aspect of impedance as mentioned above, the impedance of the upper electrode 34 seen from the processing space PS is preferably equal or greater than about 10 Ω, and more preferably, equal to or greater than about 5 Ω.

The above embodiment has been described for the ground capacitance of the upper electrode 34 that is formed of the electrode plate 36 and the electrode support 38. However, it is also possible to set up a configuration in which, by providing a vacuum space or a dielectric material between the electrode plate 36 and the electrode support 38, only the electrode plate 36 is configured as the upper electrode 34 (i.e., only the electrode plate 36 is in a floating state). Further, it is also possible to form the upper electrode 34 with, in addition to the electrode plate 36 and the electrode support 38, a separate conductive member that is connected DC-wise to the electrode plate 36 or the electrode support 38.

The frequencies of radio frequency power used in the above description of the present embodiment are merely examples, and other appropriate frequencies can be used depending on a process involved. Further, configurations of respective components of the apparatus can be modified in various ways. Further, although the above embodiment has been described for the plasma etching apparatus and the plasma etching method, the present invention can be applied to other plasma processing apparatuses and methods for, e.g., plasma CVD, plasma oxidation, plasma nitridation, sputtering and the like. Furthermore, the target object is not limited to the semiconductor wafer, but can be one of various types of substrates used for a flat panel display, a photo mask, a CD substrate, a printed circuit board or the like.

While the invention has been shown and described with respect to the embodiment, it will be understood by those skilled in the art that various changes and modifications may be made without departing from the scope of the invention as defined in the following claims.

What is claimed is:

1. A plasma processing apparatus comprising:
    a processing vessel capable of being vacuum evacuated;
    a first electrode disposed in the processing vessel to be in a state electrically isolated from the processing vessel via an insulating member or a space;
    a second electrode, arranged in the processing vessel to face and be in parallel to the first electrode with a specific interval, for supporting a substrate to be processed;
    a processing gas supply unit for supplying a desired processing gas into a processing space surrounded by the first electrode, the second electrode and a sidewall of the processing vessel; and
    a first radio frequency power supply unit for applying a first radio frequency power to the second electrode to generate a plasma of the processing gas in the processing space,
    wherein an electrostatic capacitance between the first electrode and the processing vessel is set such that a desired plasma density distribution is obtained for the plasma generated in the processing space,
    wherein a vacuum space separated from the processing space is formed between the processing vessel and a rear surface of the first electrode when viewed from the second electrode,
    wherein the vacuum space includes a ceiling portion that faces the rear surface of the first electrode,
    wherein a first insulator is disposed in the vacuum space to cover at least the ceiling portion of the vacuum space.

2. The plasma processing apparatus of claim 1, further comprising:
    a capacitance varying unit for varying an electrostatic capacitance between the first electrode and the processing vessel.

3. The plasma processing apparatus of claim 1, wherein the processing vessel is made of a conductor, and is grounded.

4. The plasma processing apparatus of claim 1, wherein an entire or partial area of the processing vessel is made up of a second insulator, wherein the area faces the rear surface of the first electrode when viewed from the second electrode.

5. The plasma processing apparatus of claim 1, wherein the first electrode is an upper electrode and the second electrode is a lower electrode.

6. The plasma processing apparatus of claim 5, wherein a gas chamber, to which a processing gas is to be introduced from the processing gas supply unit, is provided at an upper portion of or above the first electrode, and a plurality of gas injection openings for injecting the processing gas from the gas chamber into the processing space are formed in the first electrode.

7. The plasma processing apparatus of claim 6, wherein a third insulator of a ring shape is disposed between an outer peripheral surface of the first electrode and the sidewall of the processing vessel.

8. The plasma processing apparatus of claim 7, wherein the third insulator fills a gap between the outer peripheral surface of the first electrode and the sidewall of the processing vessel.

9. The plasma processing apparatus of claim 6, wherein a space is formed between an outer peripheral surface of the first electrode and the sidewall of the processing vessel.

10. The plasma processing apparatus of claim 1, wherein the first electrode is partitioned into a disk-shaped inner electrode and a ring-shaped outer electrode in a radial direction.

11. The plasma processing apparatus of claim 10, wherein a fourth insulator of a ring shape is inserted, or a space is formed, between the inner electrode and the outer electrode.

12. The plasma processing apparatus of claim 10, wherein a fifth insulator of a ring shape is inserted, or a space is formed, between the outer electrode and the sidewall of the processing vessel.

13. The plasma processing apparatus of claim 10, wherein an electrostatic capacitance between the outer electrode and the processing vessel is greater than that between the inner electrode and the processing vessel.

14. The plasma processing apparatus of claim 1, further comprising:
    a second radio frequency power supply for applying a second radio frequency power to the second electrode, wherein a frequency of the second radio frequency power is lower than that of the first radio frequency power.

15. The plasma processing apparatus of claim 1, further comprising:
    a DC power supply for applying a DC voltage to the first electrode.

16. The plasma processing apparatus of claim 1, wherein the vacuum space separated from the processing space is vacuum evacuated independently of the processing space, and maintains the vacuum state by means of an airtight structure thereof.

* * * * *